United States Patent [19]

Shinkawa et al.

[11] 4,031,472

[45] June 21, 1977

[54] MIXER CIRCUIT

[75] Inventors: Keiro Shinkawa; Chiuichi Sodeyama, both of Yokohama; Yoichi Kaneko, Tokorozawa; Katsuhiro Kimura, Tokyo, all of Japan

[73] Assignee: Hitachi, Ltd., Japan

[22] Filed: Sept. 3, 1975

[21] Appl. No.: 609,920

[30] Foreign Application Priority Data

Sept. 6, 1974 Japan .............................. 49-102671

[52] U.S. Cl. ................................. 325/446; 333/11
[51] Int. Cl.² ........................................ H04B 1/26
[58] Field of Search ................... 333/10, 11, 84 M; 325/442, 444–446, 450, 451

[56] References Cited
UNITED STATES PATENTS

| | | | |
|---|---|---|---|
| 2,874,276 | 2/1959 | Dukes et al. ........................ 333/11 |
| 2,951,149 | 8/1960 | Grieg et al. ........................ 325/445 |
| 3,534,267 | 10/1970 | Hyltin ................................. 325/445 |
| 3,619,787 | 11/1971 | Salzberg ............................ 325/446 |
| 3,624,508 | 11/1971 | Kach .................................. 325/446 |
| 3,659,206 | 4/1972 | Hallford ............................. 325/446 |
| 3,870,960 | 3/1975 | Hallford et al. .................... 325/446 |
| 3,943,450 | 3/1976 | Otremba ............................ 325/446 |
| 3,950,703 | 4/1976 | Reindel ............................. 325/446 |

*Primary Examiner*—Robert L. Griffin
*Assistant Examiner*—Marc E. Bookbinder
*Attorney, Agent, or Firm*—Craig & Antonelli

[57] ABSTRACT

A mixer circuit in which a high frequency signal and a local oscillation signal are applied to two ports respectively of a rat-race having four ports, and the other two ports are connected at one end thereof to grounded diodes respectively. An intermediate frequency signal is derived from a filter connected to a circular loop in the rat-race. The distances of the two arcuate transmission paths between the connection point of the filter and the diodes are selected to be equal to each other, and the two arcuate transmission paths between the connection point of the filter and the high frequency signal input port are selected to have a distance difference corresponding to one half the wavelength of the high frequency signal.

8 Claims, 5 Drawing Figures

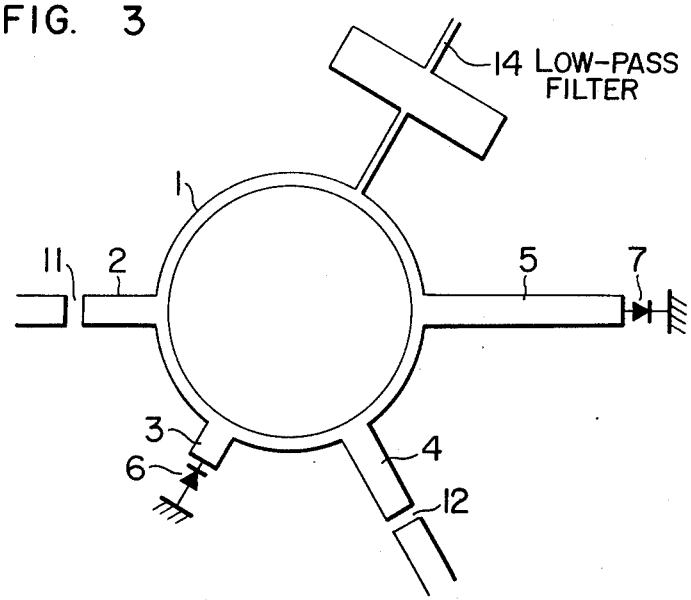
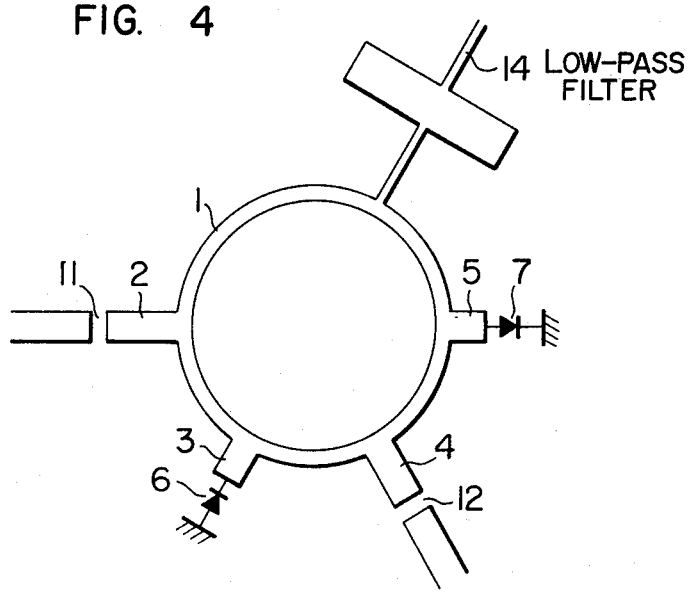

MIXER CIRCUIT

BACKGROUND OF THE INVENTION

1. Field of the Invention

This invention relates to a mixer circuit for use in radio communication equipment, and more particularly to an improved mixer circuit using a rat-race formed by microstrip lines.

2. Description of the Prior Art

A 3-dB power distributor is frequently used in a mixer circuit which is provided for the frequency conversion of a signal having a very high frequency. A rat-race is conveniently used to serve as this 3-dB power distributor due to the fact that the rat-race can operate stably over a wide frequency range compared with conventional branch line couplers. This rat-race has, for example, a structure as disclosed by W. H. Leighton, Jr, et al in a paper entitled "Junction Reactance and Dimensional Tolerance Effects on X-Brand 3-dB Directional Couplers" reported in IEEE TRANSACTION ON MICROWAVE THEORY AND TECHNIQUES, Vol. MTT-19, No. 10, Oct. 1971, pp. 818 – 824. Briefly describing this subject, the structure of this disclosed rat-race is such that a closed loop is formed by a microstrip line having a length which is three half the wavelength of a high frequency to be handled, and four microstrip lines having an impedance which is $1/\sqrt{2}$ times that of the microstrip line forming the closed loop are connected to the closed loop at intervals of quarter wavelengths starting from any desired point on the closed loop. This rat-race has such a property that, when a signal is applied by way of the first of these four lines, one half of the supplied power is transmitted to each of the second and fourth lines, while no signal is transmitted to the third line.

FIGS. 1 and 2 show principal parts of mixer circuits utilizing such a rat race. In the mixer circuit shown in FIG. 1, microstrip lines 1, 2, 3, 4 and 5 constitute the rat-race. In the form shown in FIG. 1, the lines 3 and 5 have the same length and are connected at one end thereof to the line 1 and at the other end thereof to one terminal of the diodes 6 and 7 respectively. Low-pass filters 8 and 9 are connected to the other terminal of the diodes 6 and 7 respectively for deriving intermediate frequency signals from the diodes 6 and 7. These diodes 6 and 7 are disposed in directions opposite to each other so that intermediate frequency signals of the same phase can be obtained by rotating the phase of a high frequency signal input by the rat-race. In order that the intermediate frequency signals can be derived from the low-pass filters 8 and 9, the impedance of the rat-race when viewed from the diodes 6 and 7 must be shorted against the frequency of the intermediate frequency signals. Therefore, when the lines 4 and 2 are selected as a high frequency signal input line and a local oscillation signal input line respectively, it is necessary to connect to the line 2 a stub filter 10 which is open-circuited against the local oscillation frequency and short circuited against the intermediate frequency. The mixer circuit of the structure shown in FIG. 1 is however defective in that a signal combining circuit (not shown) for combining the intermediate frequency signal outputs of the low-pass filters 8 and 9 must be disposed to extend across the high frequency signal input line 4 in the space above the plane of the mixer circuit or such signal combining circuit must be formed by extending a lead wire to the area outside of the mixer circuit.

In the mixer circuit shown in FIG. 2, microstrip lines 1, 2, 3, 4 and 5 constitute the rat-race similarly, and diodes 6 and 7 are similarly connected at one terminal thereof to one end of the lines 3 and 5 respectively. In the form shown in FIG. 2, the diodes 6 and 7 are shorted to ground at the other terminal thereof, and a low-pass filter 13 is connected to the local oscillation signal input line 2 in order to avoid an undesirable power loss of a high frequency signal input applied by the line 4. In order that an intermediate frequency signal can be derived through this output filter 13, the circuit portions except the filter 13 must be open-circuited against the intermediate frequency when viewed from the diodes 6 and 7. Therefore, capacitive means 11 and 12 which are short-circuited against a high frequency and open-circuited against a low frequency are connected in series with the input lines 2 and 4 respectively. Such capacitive means 11 and 12 are formed by cutting off a portion of suitable length from the respective lines 2 and 4. In the mixer circuit of the structure shown in FIG. 2, the intermediate frequency signals appearing from the diodes 6 and 7 are combined by the output filter 13 in the state in which a phase difference exists therebetween, and an undesirable reduction in the power of the output signal results due to the fact that the distance between the diode 6 and the output filter 13 differs from that between the diode 7 and the output filter 13. This adverse effect becomes more marked with the increase in the frequency of the intermediate frequency signal. Further, due to the fact that the output filter 13 is connected to the line 2 to which the local oscillation signal input of large power is applied, it is necessary to provide a plurality of filters in order to prevent appearance of the local oscillation frequency at the output terminal due to leakage.

The mixer circuits using the rat-race have such advantage that the local oscillation signal of large power which may be reflected by the diodes does not appear in the high frequency signal input line, in addition to such inherent advantage of the rat-race that it can operate stably over a wide frequency range. However, the mixer circuit structures above described are defective in that the intermediate frequency signal output means cannot be disposed in the same plane as that of the rat-race and an external circuit must be additionally provided, or the output power loss increases with the increase in the frequency of the intermediate frequency signal.

SUMMARY OF THE INVENTION

It is an object of the present invention to provide an improved mixer circuit which utilizes fully the inherent advantage of rat-races.

Another object of the present invention is to provide a mixer circuit of simple structure in which an output circuit can be disposed in the plane of microstrip lines constituting the rat-race and which eliminates the necessity for especial provision of any wiring extending in the space above the rat-race.

Still another object of the present invention is to provide a mixer circuit which can produce the desired output signal with improved efficiency.

The mixer circuit according to the present invention which attains the above objects comprises a rat-race constituted by a microstrip line forming a closed loop and four microstrip lines connected to this closed loop, and is featured by the fact that two diodes are connected at one terminal thereof to the predetermined microstrip lines and are grounded at the other terminal thereof, an intermediate frequency signal output line is connected to a most suitable position on the closed loop in the rat-race, and one of the predetermined microstrip lines connected to one of the diodes has a length which is greater by a value corresponding to one half the wavelength of a high frequency signal input than the other predetermined microstrip line connected to the other diode.

BRIEF DESCRIPTION OF THE DRAWINGS

FIGS. 3 to 5 are circuit diagrams showing preferred embodiments of the present invention.

DESCRIPTION OF THE PREFERRED EMBODIMENTS

Preferred embodiments of the present invention will now be described in detail with reference to FIGS. 3 to 5.

Figure 1:
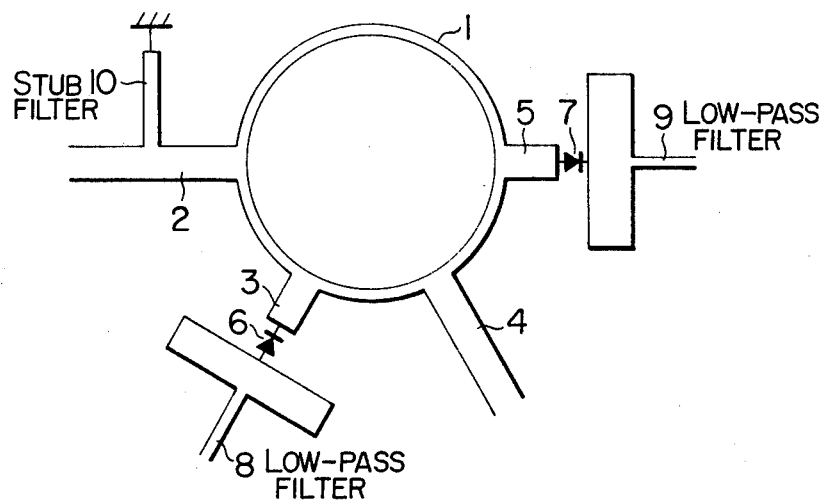
FIGS. 1 and 2 are circuit diagrams showing typical structures of a mixer circuit using a rat-race.
Figure 2:
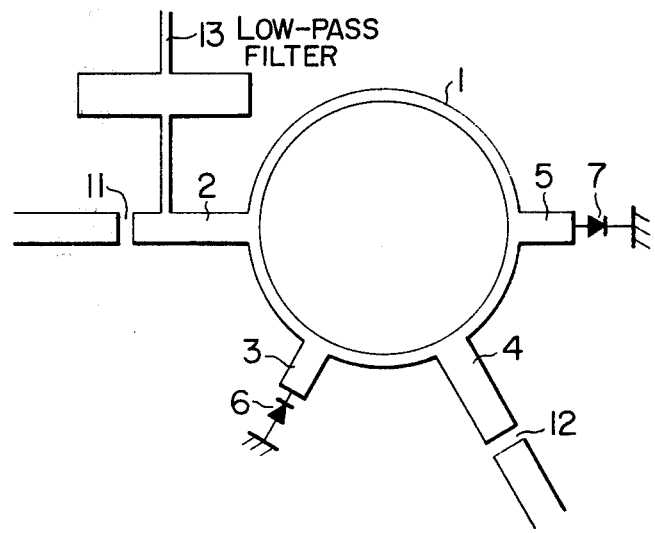

FIG. 3 shows principal parts of a preferred embodiment of the mixer circuit according to the present invention, and the same reference numerals are used therein to denote the same parts appearing in FIG. 2 in as much as the structure shown in FIG. 3 is an improvement of the structure shown in FIG. 2. The structure shown in FIG. 3 is featured by the fact that the length of the line 5 is selected to be greater than that of the line 3 by a value corresponding to one half the wavelength of the high frequency signal input, and these lines 3 and 5 are connected at the outer end thereof to one terminal of respective diodes 6 and 7 which are grounded at the other terminal thereof and which are disposed in directions opposite to each other. The present invention is further featured by the fact that a low-pass filter 14 for deriving the intermediate frequency signal is connected to the closed loop 1 in the rat-race at a position symmetrical with the line 3 relative to the center of the closed loop 1.

Referring to FIG. 3, the high frequency signal and the output of the local oscillator (not shown) are applied to the lines 4 and 2 respectively. The low-pass filter 14 is connected to the closed loop 1 at a position which is selected to provide a difference corresponding to one half the wavelength of the high frequency signal input between the distances of the two arcuate paths leading from the input port for the high frequency signal to the filter 14. Thus, the power of the high frequency input passing through one of the paths has a phase difference of 180° relative to that passing through the other path, with the result that they cancel each other substantially. The same applies to the power of the local oscillation frequency input.

It will thus be seen that the filter 14 is disposed at a position which minimizes any adverse effect on the operating characteristic of the rat-race and which prevents the high frequency power reflected by the filter 14 from appearing at the high frequency input port and permits application of such power to the diodes 6 and 7. Further, due to the fact that this filter 14 has an impedance which is open-circuited against the high frequency, the high frequency characteristic is not impaired in any way.

The high frequency signal imput and local oscillation signal input applied to the rat-race are distributed according to the power distribution characteristic of the rat-race and the distributed halves thereof are applied to the diodes 6 and 7. The power of the local oscillation frequency signal reflected by the diodes 6 and 7 does not appear in the high frequency signal input line 4 in spite of the fact that the line 5 is longer than the line 3 by the length corresponding to one half the wavelength of the high frequency signal. Intermediate frequency signals having the frequency component representing the frequency difference between the high frequency and the local oscillation frequency appear from the diodes 6 and 7 and are combined together to be delivered through the low-pass filter 14 due to the fact that the diodes 6 and 7 are grounded at one terminal thereof and the input lines 2 and 4 are open-circuited against the intermediate frequency by the provision of the capacitive means 11 and 12. Further, the intermediate frequency signals have the same phase irrespective of the frequency thereof and can be effectively combined together to provide the composite output. This is because the line 5 is extended relative to the line 3 by the length corresponding to one half the wavelength of the high frequency signal, and therefore, the arcuate distance between the diode 6 and the filter 14 is equal to the arcuate distance between the diode 7 and the filter 14.

In the embodiment shown in FIG. 3, the line 5 is extended relative to the line 3 by the length corresponding to one half the wavelength of the high frequency signal, and the position of the filter 14 is selected to be symmetrical with the line 3. It is apparent however that the line 3 may be extended relative to the line 5 by the length corresponding to one half the wavelength of the high frequency signal, and the position of the filter 14 may be selected to be symmetrical with the line 4 to achieve the same effect as that above described.

The structure shown in FIG. 3 may be modified in a manner as shown in FIG. 4 when the frequency of the intermediate frequency signal is considerably low to such an extent that it can be nearly regarded as a dc signal, since in such a case, the distance between the diode and the filter is not a matter of especial consideration. Referring to FIG. 4, the lines 3 and 5 connected to the respective diodes 6 and 7 have the same length, and yet the low frequency signal output filter 14 is disposed at the same position as that shown in FIG. 3. Therefore, the mixer circuit shown in FIG. 4 is advantageous in that the size thereof is smaller than that of the conventional ones and the output filter can be easily designed.

Figure 5:
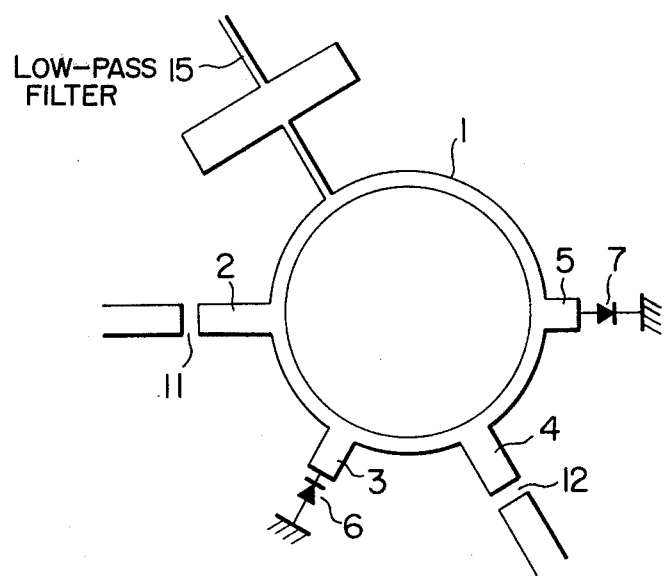

The structure shown in FIG. 4 may be modified in a manner as shown in FIG. 5 when the low frequency signal output filter has an ideal open-circuit impedance against the high frequency signal. Referring to FIG. 5, such low frequency signal output filter 15 is connected to the closed loop 1 in the rat-race at a position symmetrical with the line 4 relative to the center of the closed loop 1 so that the low frequency signals appearing from the diodes 6 and 7 can be necessarily combined together in the same phase and the composite output thus obtained can be delivered through the output filter 15. However, due to the fact that this output filter 15 is disposed at the position at which the power of the high frequency signal passing through the two paths is maximum, the power distribution characteristic of the rat-race tends to be adversely affected unless the filter 15 has an ideal open-circuit impedance against the high frequency signal. In spite of such a tendency, the mixer circuit shown in FIG. 5 is advantageous over that shown in FIG. 2 in that it can be sufficiently miniaturized.

It will be understood from the foregoing description that the present invention provides a mixer circuit using a rat-race including a microstrip line forming a closed loop and four microstrip lines connected to the closed loop, in which a pair of diodes grounded at one terminal thereof are respectively connected at the other terminal thereof to the predetermined ones of the microstrip lines having a difference corresponding to one half the wavelength of a high frequency signal input between the lengths thereof, and an output line for a low frequency signal is connected to a most suitable position on the closed loop in the rat-race. Therefore, the present invention eliminates the necessity for especial provision of a separate circuit extending over the plane of the rat-race resulting in complexity of the circuit structure. Further, the present invention overcomes various prior art defects including an undesirable reduction of the signal combining efficiency due to the phase difference of low frequency outputs of the diodes. According to the present invention, the properties of the rat-race can be fully utilized to obtain the mixer circuit which can operate stably over a wide frequency range.

The present invention has been described with reference to a planar mixer circuit structure for operation with an ultra-high frequency in which microstrip lines are the basic parts. However, it is apparent that the present invention is equally effectively applicable to a mixer circuit of coaxial line structure.

We claim:

1. A mixer circuit for converting a high frequency signal into an intermediate frequency signal comprising:
    a rat-race including a first transmission line forming a circular closed loop having an overall circumferential length corresponding to three halves the wavelength of the high frequency signal, a second transmission line connected to said first transmission line and having an impedance which is $1/\sqrt{2}$ times the impedance of said first transmission line, and a third, a fourth and a fifth transmission line connected to said first transmission line in such a relationship that they are successively spaced apart from the connection point of said second transmission in the above order along said first transmission line by an arcuate distance corresponding to one quarter the wavelength of the high frequency signal, said third, fourth and fifth transmission lines having an impedance equal to that of said second transmission line;
    means for supplying said high frequency signal to be subject to the frequency conversion to one of said second and fourth transmission lines in said rat-race and supplying a local oscillation signal to the other of said second and fourth transmission lines connected to said rat-race;
    a pair of diodes grounded at one terminal thereof and connected at the other terminal thereof to the other end of said third and fifth transmission lines respectively; and
    output means connected to said first transmission line at a position forming a straight line passing through the connection of one of said third and fourth transmission lines to said first transmission line relative to the center of said circular closed loop formed by said first transmission line in said rat-race being on said straight line, for delivering an output signal having a frequency component representing the frequency difference between said high frequency signal and said local oscillation signal.

2. A mixer circuit as claimed in claim 1, wherein said fifth transmission line is longer than said third transmission line by a length corresponding to one half the wavelength of said high frequency signal, and said output means for delivering the output signal having the frequency component representing the frequency difference between said high frequency signal and said local oscillation signal is disposed at a position of point symmetry with respect to said third transmission line.

3. A mixer circuit for converting a high frequency signal into an intermediate frequency signal comprising:
    a rat-race including a first transmission line forming a circular closed loop having an overall circumferential length corresponding to three halves the wavelength of the high frequency signal, a second transmission line connected to said first transmission line and having an impedance which is $1/\sqrt{2}$ times the impedance of said first tranmission line, and a third, a fourth and a fifth transmission line connected to said first transmission line in such a relationship that they are successively spaced apart from the connection point of said second transmission line in the above order along said first transmission line by an arcuate distance corresponding to one quarter the wavelength of the high frequency signal, said third, fourth and fifth transmission lines having an impedance equal to that of said second transmission line;
    means for supplying said high frequency signal to be subject to the frequency conversion to one of said second and fourth transmission lines in said rat-race and supplying a local oscillation signal to the other of said second and fourth transmission lines connected to said rat-race;
    a pair of diodes grounded at one terminal thereof and connected at the other terminal thereof to the other end of said third and fifth transmission lines respectvely; and
    an output transmission line connected to a point of said first transmission line spaced apart from the connecting point of said first and third transmission lines by three quarters wavelength of said high frequency signal for delivering an output signal having a frequency component representing the frequency difference between said high frequency signal and said local oscillation signal.

4. A mixer circuit as claimed claim 3, wherein said fifth transmission line is longer than said third transmission line by a length corresponding to one half the wavelength of said high frequency signal.

5. A mixer circuit according to claim 3, further comprising a filter means connected to said output transmission line for selectively passing said intermediate frequency signal.

6. A mixer circuit for converting a high frequency signal into an intermediate frequency signal comprising:
    a rat-race including a first transmission line forming a circular closed loop having an overall circumferential length corresponding to three halves the wavelength of the high frequency signal, a second transmission line connected to said first transmission line and having an impedance which is $1/\sqrt{2}$ times the impedance of said first transmission line, and a third, a fourth and a fifth transmission line connected to said first transmission line in such a relationship that they are successively spaced apart from the connection point of said second transmission line in the above order along said first transmission line by an arcuate distance corresponding to one quarter the wavelength of the high frequency signal, said third, fourth and fifth transmission lines having an impedance equal to that of said second transmission line;

means for supplying said high frequency signal to be subject to the frequency conversion to one of said second and fourth transmission lines in said rat-race and supplying a local oscillation signal to the other of said second and fourth transmission lines connnected to said rat-race;

a pair of diodes grounded at one terminal thereof and connected at the other terminal thereof to the other end of said third and fifth transmission lines respectively; and an output transmission line connected to a point of said first transmission line spaced apart from the connecting point of said first and fourth transmission lines by an arcurate distance of three quarters wavelength of said high frequency signal for delivering an output signal having a frequency component representing the frequency difference between said high frequency signal and said local oscillation signal.

7. A mixer circuit as claimed in claim 6, wherein said fifth transmission line is longer than said third transmission line by a length corresponding to one half the wavelength of said high frequency signal.

8. A mixer circuit according to claim 6, further comprising a filter means connected to said output transmission line for selectively passing said intermediate frequency signal.

* * * * *